SEMICONDUCTOR SURFACE CLEANING
Filed March 18, 1963
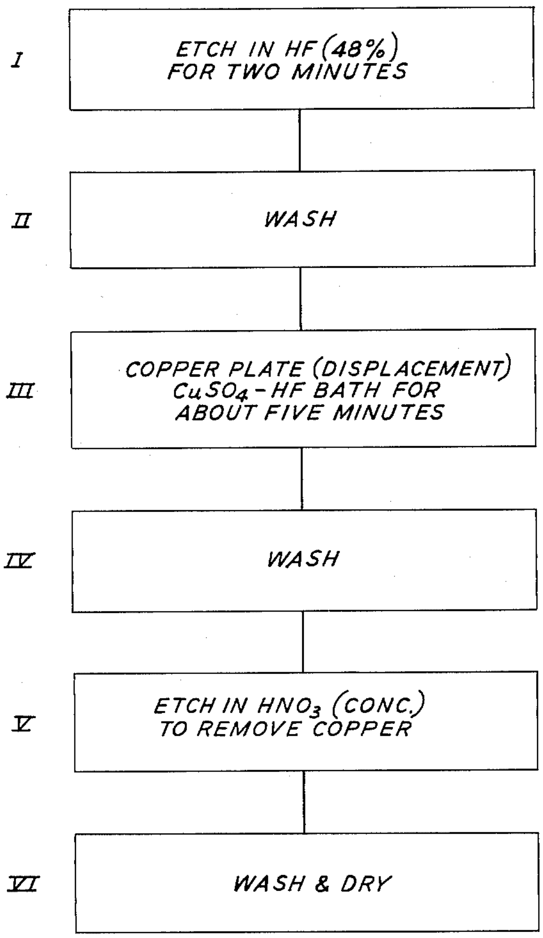
INVENTOR
D. L. KLEIN
BY H. W. Lockhart
ATTORNEY United States Patent Office 3,224,904

Patented Dec. 21, 1965

3,224,904
SEMICONDUCTOR SURFACE CLEANING

Donald L. Klein, New Providence, N.J., assignor to Bell Telephone Laboratories, Incorporated, New York, N.Y., a corporation of New York Filed Mar. 18, 1963, Ser. No. 265,612
7 Claims. (Cl. 134—4)

This invention relates to a process for treating surfaces of semiconductor bodies and more specifically to a process for removing contaminants and particulate matter from semiconductor surfaces.

It is axiomatic now that clean surfaces are essential to improved semiconductor devices. A considerable segment of the art is devoted to techniques for producing surfaces approaching perfect cleanliness. Cleaning methods must take into account the effects of mechanical damage to crystal surfaces, the presence of a wide variety of organic and metallic contaminants, and limitations on the amount of material which can be removed during such cleaning. This latter limitation is of consequence particularly in the case of diffused junction devices, where the diffusion depths are of the order of microns or less. Moreover, in certain instances, it has been found that an undesirable haze occurs on the surface of silicon semiconductor material which has been abrasively prepared. This haze has been determined to comprise particulate matter, the presence of which is deleterious to subsequently fabricated devices.

In particular, microscopic particles may be present as debris on semi-conductor surfaces and can have a variety of deleterious effects. Such particles may cause unwanted impurity doping of the semiconductor material during subsequent heat treatments, for example, where the particles include alumina which is reduced to aluminum. Such particles on a surface used for epitaxial deposition generate imperfections which are propagated through the films.

Accordingly, an object of this invention is an improved process for treating semi-conductor surfaces.

More particularly, it is an object of the invention to clean abrasively prepared surfaces and diffused semiconductor surfaces by controlled removal of semiconductor material.

In accordance with one form of the invention, a semiconductor body of single crystal silicon, which has been polished by mechanical lapping or liquid honing, is placed in a copper plating solution in which, by chemical displacement, copper is deposited and silicon removed from the surface of the body. In accordance with the invention, the reaction rate is precisely known and therefore controlled by the time of plating. Following the plating operation, the material is water washed and transferred to a concentrate nitric acid bath in which all traces of copper plating are removed. Finally, the semiconductor body is washed repeatedly in water to ensure cessation of any etching action. After drying, the material is ready for storage or for further processing.

In another procedure, in accordance with the invention, if the semiconductor material being treated has surfaces stained from surface films, as a result of diffusion treatments, for example, the above-described procedure is preceded by an immersion in hydrofluoric acid primarily to remove the glasses formed during such diffusion heat treatment.

One feature of the method of this invention is that displacement metal plating occurs at a rate which renders removal of semiconductor material readily controllable.

Another feature resides in the use of displacement metal plating to effectively "underplate" and "undercut" unwanted material adherent to the semiconductor surface.

One preferred embodiment of the invention is set forth in the process flow chart shown in the drawing. A better understanding of the invention may be had from the drawing and the following detailed explanation of the invention.

The process is accordance with this invention is advantageous for silicon semiconductor slice material which has been diffused particularly by the well-known paint-on diffusion technique. Such sliced material generally contains in its surface layers, so-called stains as well as oxides and glasses resulting from the previous processing operations.

In accordance with the invention as shown in step I, the slice is immersed in hydrofluoric acid primarily to remove the heavy oxides and glasses on the silicon surface. Advantageously, this acid may be 48 percent concentration, reagent grade Typically, this etching step is carried on for two minutes after which the slice is washed in copious amounts of water to stop the etching action (step II). One practice is simply to flow large volumes of water directly into the etching container.

Next, as illustrated in step III of the flow chart, the wet slice is placed in a copper plating solution for a period of the order of minutes. The copper plating bath is a copper sulfate-hydrofluoric acid solution which may be in the following proportions:

| | | |
|---|---|---|
| $CuSO_4 \cdot 5H_2O$ | gm | 55 |
| HF | ml | 50 |
| Deionized water | ml | 950 |

The plating bath is maintained at room temperature and the copper deposition rate from this bath is 1.36 m.s.i. per minute. This deposition rate corresponds to the rate of removal of silicon which in absolute terms is equal to approximately 2,000 angstroms per minute. Typically, the plating time may be five minutes which corresponds to the removal of about 10,000 angstroms of silicon.

The plating operation is stopped by washing the slice again in water, as indicated in step IV of the flow chart. Finally, the wet slice is immersed in concentrated nitric acid (70 percent reagent grade). This step dissolves the copper plating without substantially affecting the silicon. During this etching treatment, the copper plating is completely removed and an almost perfectly clean silicon surface is thereby exposed at a predetermined depth from the original surface. The slice finally is washed several times in standard cleaning baths of acetone and trichloroethylene and, upon drying, then is ready for further fabrication or clean storage until needed.

The foregoing described process may be modified by omitting steps I and II if the material being treated does not have the glassy surfaces produced, typically, by diffusion heat treatments. This is particularly directed to semiconductor material which has been polished using abrasives which then are to be subjected to diffusion treatments. Abrasive debris on the semiconductor surface appears physically as a haze and has been observed microscopically to comprise discrete particles of solid matter, In particular, where such particles are alumina or other metallic compounds, several undesirable effects have been observed. If the semiconductor material is heated for a diffusion treatment, alumina, for example, may be reduced to aluminum which then dopes the semiconductor material as an acceptor. The presence of this particulate matter on a surface which is used for epitaxial deposition or for oxide passivating film growth results in an entrapped material which degrades the resulting device. As mentioned hereinbefore in the case of epitaxial deposition, the presence of foreign particles on single crystal surfaces propagate imperfections into the growing film. And, in the case of protective oxide coating, the entrapped particles are a source of possible conductivity inversion and lowering of the dielectric strength.

The displacement metal plating process of this invention has been found most advantageous for ensuring the removal of such particulate matter, evidently by the effective undercutting of such particles as a consequence of the removal of adjacent semiconductor material during the displacement process. The displacement metal plating has been found effective where previous chemical treatments and washing have proven ineffective to remove particulate material. Moreover, surfaces prepared in accordance with this invention are easier to contact by metal evaporation.

In addition to the embodiment described above, displacement copper plating has been found effective also for cleaning germanium and gallium arsenide semiconductor surfaces. In connection with these two semiconductor materials, it has been found advantageous to use a potassium hydroxide plating bath in place of the acid bath employed with silicon. In particular, one such bath is composed as follows:

| | |
|---|---|
| $CuCl_2$ (1 percent solution) ----------------ml-- | 100 |
| KOH ----------------------------------gm-- | 100 |
| Deionized water --------------------------ml-- | 100 |

An effective displacement plating has been produced by using this bath for about five minutes at a temperature of 75 to 80 degrees centigrade. In connection with this plating, as well as in the plating of silicon, the results may be enhanced by agitation or stirring during the plating operation.

Although copper has been found effective for the purposes of this invention, and from an economical standpoint is very desirable, other metals may be similarly employed, for example, displacement plating of silver and gold may effect similar results. In general, it appears that the important ingredient in this process is that a true displacement plating shall occur which effectively loosens the surface-held debris whether held by electrostatic or mechanical attraction or by the formation of surface compounds, for example, alumina ($Al_2O_3$) on silicon may form aluminum silicates.

It will be understood that other solvents may be employed for removing the metal platings, and their selection depends upon other circumstances such as the presence of other materials or the degree of attack permitted upon the semiconductor material itself, for example, ferric chloride is a well-known solvent for copper which likewise may be employed. In the case of silver and gold platings, other solvents are well known. Moreover, it is within the skill of the art to vary the concentrations of reagents set forth in the solutions described above in order to vary the deposition rate or the subsequent removal rate.

Accordingly, although the invention has been disclosed in terms of certain specific embodiments, it will be understood that variations may be made by those skilled in the art which still will be in the spirit and scope of the invention.

What is claimed is:

1. A method of cleaning a body of semiconductor material selected from the group consisting of silicon, germanium and gallium arsenide having impurities thereon, which comprises immersing said body in a displacement copper plating solution for a period of several minutes, washing the body, removing the metal plating by immersing the body in a solution which does not substantially attack the semiconductor material, and washing the body.

2. A method in accordance with claim 1 in which the copper plating is removed by immersing in nitric acid.

3. A method of cleaning a silicon semiconductor body having a major surface which has been abrasively polished which comprises immersing said body in a displacement copper plating solution for a period of several minutes, and then immersing the body in nitric acid for a period of time sufficient to remove the copper plating without substantially attacking the underlying silicon.

4. A method of cleaning a silicon semiconductor body which has been subjected to a diffusion heat treatment which comprises immersing the body in a solution of hydrofluoric acid for about two minutes, washing said body, immersing the body in an acid-copper sulfate solution for a period of several minutes thereby to remove by displacement a determined amount of silicon, and then immersing the body in nitric acid for a period of time sufficient to remove the copper plating without substantially attacking the underlying silicon.

5. A method of cleaning a body of silicon semiconductor material having impurities thereon which comprises immersing the body in a displacement plating bath comprising copper sulfate and hydrofluoric acid in the order of minutes, washing said body, removing the copper plating by immersing the body in nitric acid, and washing said body.

6. A method of cleaning a body of germanium semiconductor material having impurities thereon which comprises immersing the body in a displacement plating bath comprising a base and a copper compound for a period of the order of minutes, washing said body, removing the copper plating by immersing the body in a solvent which does not substantially attack the germanium, and washing said body.

7. A method in accordance with claim 6 in which said displacement plating bath comprises copper chloride and potassium hydroxide and said solvent is nitric acid.

References Cited by the Examiner

UNITED STATES PATENTS

| | | | |
|---|---|---|---|
| 2,323,599 | 7/1943 | Hawk ------------- | 29—25.35 |
| 2,771,382 | 11/1956 | Fuller. | |

ALEXANDER WYMAN, *Primary Examiner.*

JACOB STEINBERG, *Examiner.*